(12) United States Patent
Itzler

(10) Patent No.: US 7,719,029 B2
(45) Date of Patent: May 18, 2010

(54) NEGATIVE FEEDBACK AVALANCHE DIODE

(75) Inventor: Mark Allen Itzler, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 49 days.

(21) Appl. No.: 11/750,244

(22) Filed: May 17, 2007

(65) Prior Publication Data

US 2008/0283953 A1   Nov. 20, 2008

(51) Int. Cl.
    *H01L 29/8605* (2006.01)
(52) U.S. Cl. .............................. 257/186; 257/E31.064; 257/E31.116; 257/431; 257/199; 257/322; 257/438; 257/481; 257/492; 257/493; 257/551; 257/603; 257/E31.063; 257/E29.335; 257/E21.355; 257/E21.357
(58) Field of Classification Search ........................ None
    See application file for complete search history.

(56) References Cited

U.S. PATENT DOCUMENTS

| | | | | |
|---|---|---|---|---|
| 6,597,110 | B1 * | 7/2003 | Thompson et al. | 313/506 |
| 2004/0245592 | A1 | 12/2004 | Harmon et al. | |
| 2004/0251483 | A1 * | 12/2004 | Ko et al. | 257/292 |
| 2006/0108657 | A1 * | 5/2006 | Raynor | 257/438 |

OTHER PUBLICATIONS

"Thin Film Resistors vs Thick Film Resistors—How They Compare" US Microwaves. Jan. 31, 2004 http://www.usmicrowaves.com/ap-pnotes/thin_film_resistors_versus_thick_film_resistors_how_they_compa.*

Brian F. Aull, et al., Geiger-Mode Avalanche Photodiodes for Three-Dimensional Imaging, Lincoln Laboratory Journal, vol. 13, No. 2, 2002, pp. 335-350.

V. Saveliev, V. Golovin, Silicon avalanche photodiodes on the base of metal-resistor-semiconductor (MRS) structures, Nuclear Instruments and Methods in Physics Research A 442 (2000) 223-229.

A. Khodin, et al., Localised feedback in silicon-based avalanche photodiodes, Nuclear Instruments and Methods in Physics Research A 513 (2003) 178-182.

Valeri Saveliev, The recent development and study of silicon photomultiplier, Nuclear Instruments and Methods in Physics Research A 535 (2004) 528-532.

S. Afanasiev, et al., MRS Silicon Avalanche Detectors with Negative Feedback for Time-of-Flight Systems, Nuclear Physics B (Proc. Suppl.) 44 (1995) 402-405.

Vitaly Shubin, Dmitry Shushakov, New avalanche device with the ability of analog few-photon pulse detection, SPIE vol. 2550, (0-8194-1909-5/95), pp. 284-293.

* cited by examiner

*Primary Examiner*—Minh-Loan T Tran
*Assistant Examiner*—Fei Fei Yeung Lopez
(74) *Attorney, Agent, or Firm*—DeMont & Breyer, LLC

(57) ABSTRACT

A single-photon avalanche detector is disclosed that is operable at wavelengths greater than 1000 nm and at operating speeds greater than 10 MHz. The single-photon avalanche detector comprises a thin-film resistor and avalanche photodiode that are monolithically integrated such that little or no additional capacitance is associated with the addition of the resistor.

13 Claims, 5 Drawing Sheets

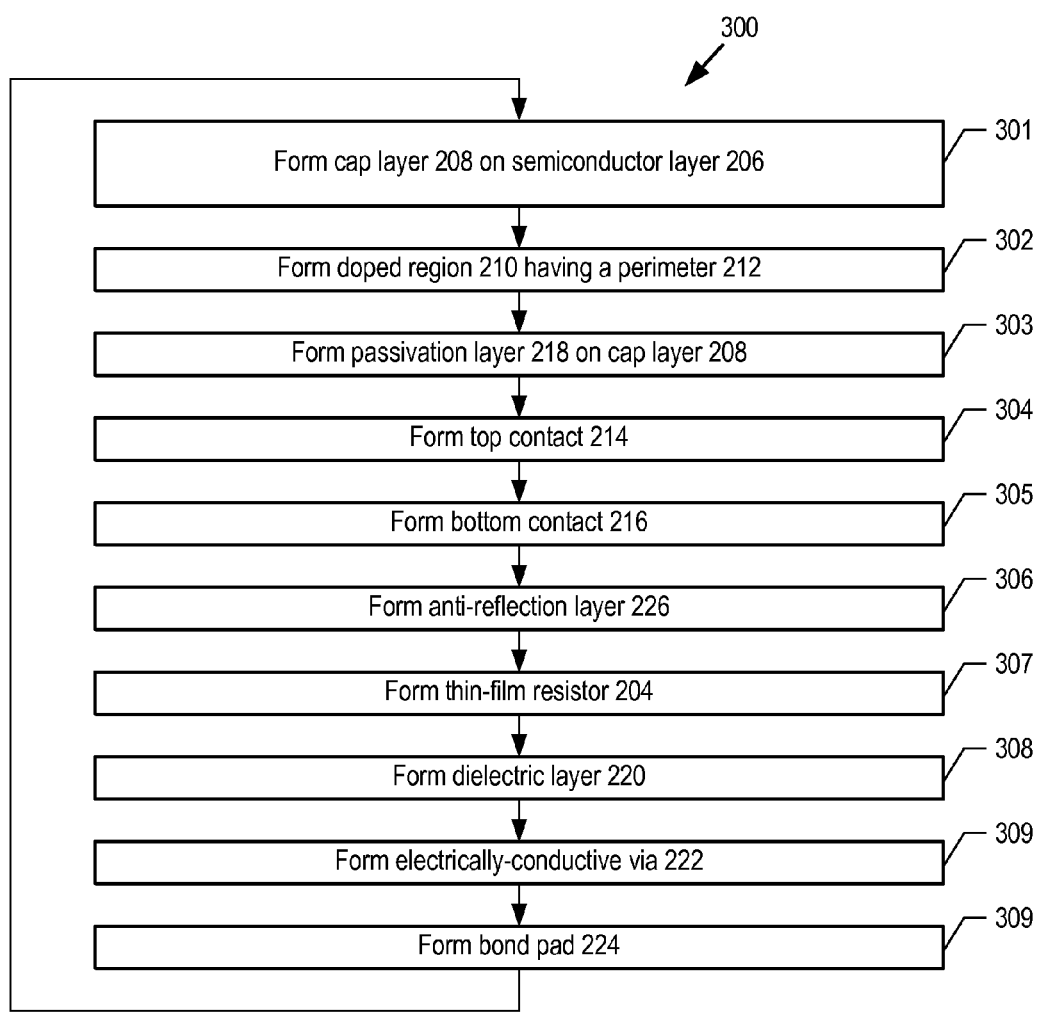

NEGATIVE FEEDBACK AVALANCHE DIODE

The U.S. Government has a paid-up license in this invention and the right in limited circumstances to require the patent owner to license others on reasonable terms as provided for by the terms of Contract No. NNG07CA02C awarded by the National Aeronautics and Space Administration (NASA).

FIELD OF THE INVENTION

The present invention relates to avalanche photodetectors in general, and, more particularly, to single-photon avalanche photodetectors.

BACKGROUND OF THE INVENTION

Photodetectors capable of detecting a single-photon (a single "particle" of optical energy) are useful in many applications. To date, most of these applications have relied on the use of single-photon detectors such as photomultiplier tubes (PMTs) or single-photon avalanche detectors (SPADs) that are silicon-based, and are therefore capable of efficiently detecting only photons that have a wavelength within the range of approximately 250 nanometers (nm) to approximately 900 nm. New applications are emerging, however, that require single-photon detectors that can operate at high speed (>1 MHz) and at longer wavelengths (>1000 nm). Such devices would find use in areas such as: quantum information processing, quantum computing, quantum cryptography, and quantum teleportation and communications; low-light-level imaging and other high-performance imaging applications; and others. Unfortunately, currently available SPADs do not have the combination of high operational speed and wavelength range required for many of these applications.

An avalanche photodiode is one type of photodetector that is capable of providing extremely high sensitivity. In fact, an avalanche photodiode can be made sensitive enough to provide a discernable output signal upon the receipt even a single photon.

Avalanche photodiodes derive their name from the manner in which their output signal is created. When photons are absorbed by an avalanche photodiode, their energy frees bound charge carriers (electrons and holes) that then become free-carrier pairs. In the presence of an electric field (due to a bias voltage applied to the photodiode), these free-carriers are accelerated through a region of the avalanche photodiode referred to as the "multiplication region." As the free carriers travel through the multiplication region, they collide with other carriers bound in the atomic lattice of the semiconductor, thereby generating more free carriers through a process called "impact ionization." These new free-carriers also become accelerated by the applied electric field and generate yet more free-carriers. This avalanche event can occur very rapidly and efficiently and it is possible to generate several hundred million free-carriers from a single absorbed photon in less than one nanosecond.

An avalanche photodiode is characterized by its "breakdown voltage." A photodiode's breakdown voltage is a bias level above which free-carrier generation can become self-sustaining and result in run-away avalanche. To enable it for single-photon detection, an avalanche photodiode is biased with a voltage that is larger than its breakdown voltage. This is referred to as "arming" the photodiode. Once the photodiode is armed, a single free carrier pair created by the absorption of a single photon can create a runaway avalanche resulting in an easily detectable macroscopic current.

Once a signal has been generated as a result of the absorption of a photon, it is necessary to stop the self-sustained avalanche so that the photodiode can be rearmed to detect another photon. To halt the avalanche process, the bias voltage of the avalanche photodiode is reduced below its breakdown voltage. This process is referred to as "quenching" the avalanche photodiode.

The rate at which a single-photon detector can be operated is determined by two factors: 1) how fast an avalanche event can be stopped once it is detected; and 2) how fast the avalanche detector can be re-armed once the avalanche event has been stopped.

Although quenching stops the avalanche process, not all free carriers are instantaneously swept out of the avalanche region. Instead, some carriers become trapped in trap energy states in the multiplication region that exist due to crystalline defects or other causes. These trapped carriers become released in a temporally random manner as a function of temperature, the type of trap state, and the applied bias voltage. If a trapped carrier is released after the SPAD has already been re-armed (by biasing above the breakdown voltage), it is likely to initiate impact ionization in the same manner as the free-carriers that resulted from the absorption of a photon. As a result, the detrapping of a carrier is likely to result in the detection of an electrical signal that is not due to the absorption of a photon. A "false" electrical signal that occurs in the absence of photon absorption is referred to as a "dark count." Dark counts due to the detrapping of trapped carriers are referred to as "afterpulses."

Because dark counts constitute noise in a single-photon avalanche detector, they degrade its sensitivity. Trapped charges will generally become free carriers in random fashion due to, for example, thermal emission from the trap. One approach for achieving high sensitivity detection is to simply delay rearming after quenching to allow trapped charges a sufficient period of time to detrap while the SPAD remains unarmed. In this way, the resulting afterpulse rate can be reduced to an acceptable limit. This approach, however, results in an undesirably long period of time when the single-photon detector is inoperable. To date, afterpulsing has limited the use of single-photon detectors that are sensitive to wavelengths of light greater than 1000 nm to maximum rates of approximately 1 MHz.

Several approaches for reducing afterpulse effects could be considered in order to increase the operation rate of single-photon detectors. These include 1) actively inducing rapid detrapping of trapped charges; 2) limiting the number of free-carriers that flow through the multiplication region during an avalanche event; and 3) stifling the detrapping of trapped charges.

Trapped charges can be induced to more rapidly detrap by elevating the temperature of the photodiode or energizing the carriers by illuminating them with light at a different wavelength. These approaches, however, have shown very limited success: elevating the photodiode temperature imposes a severe tradeoff by increasing the dark count rate, and sub-bandgap illumination has not yet been shown to effectively induce carrier detrapping. In addition, their added cost and complexity make these approaches undesirable in many applications.

It is theoretically possible to limit the number of free-carriers that flow through the multiplication region during an avalanche event by actively quenching the photodiode using external circuitry. Practical limitations of even state-of-the-art electronics (e.g., circuit gain-bandwidth limitations) make this approach infeasible in many applications, however. In addition, the added capacitance associated with the external circuitry can slow the rate at which an avalanche photodiode can recharge while being rearmed. The rate at which a SPAD can be rearmed is dictated by the product of the photodetector's capacitance and resistance (referred to as the RC time constant). For high speed operation (i.e., >1 MHz), this RC time constant must be less than about 1 microsecond. As a result, any capacitance associated with external electronics that adds to the capacitance of the SPAD itself is generally undesirable.

It has been demonstrated that the number of free-carriers can be limited successfully through passive quenching in a device that includes an integrated resistor as part of the photodiode structure itself. This approach is described in papers that include "MRS Silicon Avalanche Detectors with Negative Feedback for Time-of-Flight Systems," by Afanasiev, et. al., published in *Nuclear Physics B*, Vol. 44, in 1995, and "Localized feedback in silicon-based avalanche photodiodes," by Khodin, et al., published in *Nuclear Instruments and Methods in Physics Research A*, Vol. 513, in 2003. In this approach, a so-called "negative feedback" resistor is integrated within a special photodiode structure (referred to as an MRS Photodiode) to passively limit the number of free-carriers generated during an avalanche event. This feedback resistor is, in fact, an integral part of the MRS Photodiode structure. Indeed, MRS is an acronym for Metal-Resistor-Semiconductor, and the operation of an MRS Photodiode relies on the presence of this resistor layer.

However, the MRS structure can only be readily fabricated in the silicon material system. This material system is well-suited to the MRS structure because of the availability of material suitable for forming a resistive layer (namely, silicon carbide (SiC)). Silicon carbide has an appropriate bulk-resistivity and it can be epitaxially-grown on silicon. Unfortunately, the absorption coefficient of silicon drops off sharply as the wavelength of an incident photon approaches 1000 nm. As a result, the silicon-based MRS Photodiode is effectively inoperable at wavelengths greater than 1000 nm.

For operation at wavelengths longer than 1000 nm, photodiodes require materials such as III-V or II-VI semiconductors and/or their compounds. The MRS Photodiode structure is difficult, if not impossible, to fabricate in these material systems, however, since no appropriate resistive layer can be formed as part of the diode structure. This is because these material systems do not exhibit a layer that can be provided with the proper bulk resistivity for a practical resistive layer that can be incorporated into an MRS Photodiode structure.

As a means of quenching avalanche events in canonical SPADs, a discrete resistor that is electrically-connected to the photodiode has been used in the past. Passive quenching has been successfully demonstrated in this manner; however, inevitable large parasitic capacitances associated with the addition of a discrete resistor require very significant discharging and recharging in the avalanche and re-charge cycle of SPAD device operation. The accompanying large current flow results in significant carrier trapping and subsequent afterpulsing effects that, to date, have only been mitigation by employing long "hold-off" times (on the order of 1 microsecond or longer) before re-arming the SPAD. Due to these required hold-off times, the operational rate of these photodetectors has remained limited to approximately 1 MHz or less.

The stifling of trapped charges by lowering the temperature of a SPAD to "freeze" trapped charge carriers has not been successfully demonstrated. In fact, for practical SPAD devices, this approach is likely to increase after-pulsing as temperature is reduced. Further, if carrier freeze-out were successful, it is likely that at least some of the charge carriers associated with the dopant atoms would also be "frozen," thus rendering the SPAD inoperable.

There exists a need therefore, for a single-photon detector that operates at wavelengths longer than 1000 nm and that can be operated at rates greater than 10 MHz.

SUMMARY OF THE INVENTION

The present invention enables high-repetition-rate single-photon detection for photons having wavelengths greater than 1000 nm at repetition rates not achievable using the prior art. For example, some embodiments of the present invention enable single-photon detection for photons in the 1000 to 1600 nm wavelength range at operating rates greater than 10 MHz.

As in the prior art, passive quenching of an avalanche event is accomplished by means of local negative feedback. In the prior art, silicon-based MRS Photodiodes inherently include a resistor as part of their MRS structure. This resistor provides negative feedback that passively quenches an avalanche event. These MRS Photodiodes are well suited for detection of a photon having a wavelength within the absorption band of silicon (i.e., less than approximately 900 nm). These MRS Photodiodes are not operable for photons having wavelengths longer than about 900 nm, however.

In contrast to the prior art, the present invention employs passive quenching within a single-photon photodetector that IS operable at wavelengths longer than 900 nm. Since the MRS structure is not easily fabricated using III-V or II-VI semiconductor material systems, however, passive quenching has been accomplished in the present invention by means of a thin-film resistor that is monolithically-integrated with a SPAD. The thin-film resistor is integrated with the SPAD in such a way as to provide passive quenching without substantially increasing the capacitance of the photodetector structure. In contrast to the prior art, therefore, embodiments of the present invention are operable for photons having wavelengths longer than 1000 nm AND operate at speeds in excess of 10 MHz.

Embodiments of the present invention comprise a thin-film resistor and avalanche photodiode that are monolithically integrated. The thin-film resistor is located substantially within the perimeter of the doped region of the avalanche photodiode. As a result, little or no additional capacitance is associated with the addition of this thin-film resistor. The RC time constant associated with the rearming of the SPAD, therefore, is not adversely affected. In some embodiments, the RC time constant of the photodetector is held to less than 100 ns. In some embodiments, the RC time constant of the photodetector is held to less than 10 ns.

An embodiment of the present invention comprises a method of forming a negative feedback avalanche photodetector comprising: forming a cap layer, wherein the cap layer comprises a material selected from the group consisting of III-V compound semiconductors or II-VI compound semiconductors, forming a first doped region within the cap layer, wherein the first doped region defines a first perimeter, and forming a first thin-film resistor having a first terminal and a second terminal, wherein the first thin-film resistor is disposed above the cap layer, and wherein the first thin-film resistor is located completely within the first perimeter, and further wherein the first terminal and the first doped region are electrically-connected.

BRIEF DESCRIPTION OF THE DRAWINGS

FIG. 3 depicts a method of forming a negative feedback avalanche detector for detecting and counting single photons having a wavelength greater than 1000 nm in accordance with the illustrative embodiment of the present invention.

DETAILED DESCRIPTION

The following terms are defined for use in this Specification, including the appended claims:

Electrically-coupled means that two elements are in either direct or indirect electrical communication. This can be via direct physical contact (e.g., a plug in an electrical outlet, etc.), via an electrically-conductive intermediate (e.g., a wire or conductive trace that interconnects the devices, etc.), or via one or more intermediate devices, etc. (e.g., resistors, capacitors, transistors, etc.).

Electrically-connected means that two elements are in direct electrical contact without any intervening devices (e.g., resistors, capacitors, transistors, etc.). In other words, the point or region of contact between the two elements remains at a substantially uniform voltage for substantially any current (i.e., the two elements are "shorted" together). For the purposes of this definition, an electrically-conductive wire or trace that serves only to interconnect the two elements is NOT considered an intervening device.

Figure 1A:
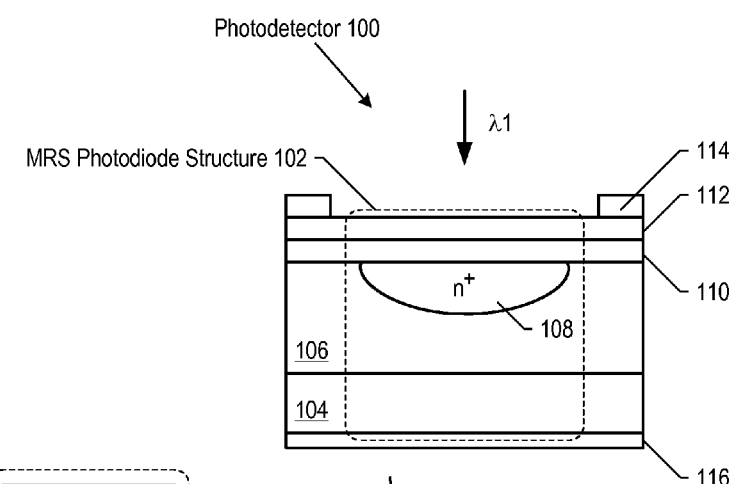
FIG. 1A depicts a cross-sectional view of details of a negative-feedback photodetector based on an MRS Photodiode in accordance with the prior art.
Figure 1B:
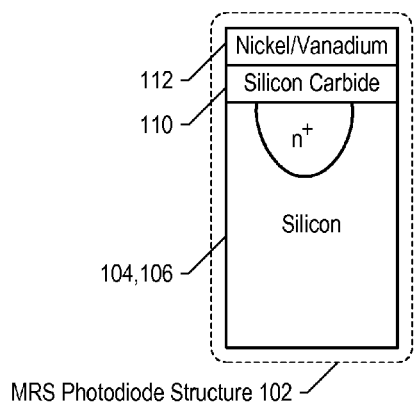
FIG. 1B depicts a cross-sectional view of details of an MRS Photodiode structure in accordance with the prior art.

FIG. 1A depicts a cross-sectional view of details of a silicon-based MRS Photodiode in accordance with the prior art. Silicon-based MRS Photodiodes were presented by Afanasiev and Khodin, as discussed in the background section. FIG. 1B depicts a more detailed view of the MRS Photodiode structure of FIG. 1A.

Photodetector 100 comprises MRS Photodiode 102. An MRS Photodiode is a distinct photodiode structure that consists of a metal region disposed on a resistive region disposed on a semiconductor region. Each of these regions is an inherent part of the device structure, and its operation depends upon all three regions being present. Indeed, MRS stands for Metal-Resistor-Semiconductor.

MRS Photodiode 102 comprises a portion of silicon layers 104 and 106, a doped region 108, a portion of resistive layer 110, and a portion of semitransparent metal layer 112. A voltage bias is applied to MRS Photodiode 102 by applying a voltage potential across top contact 114 and bottom contact 116.

Referring now to FIG. 1B, the layer structure of MRS Photodiode 102 is depicted. MRS Photodiode 102 comprises lower silicon layer 104, upper silicon layer 106, resistive layer 110 and semitransparent metal layer 112.

Lower silicon layer 104 is a silicon layer that has been heavily doped with a p-type dopant such that lower silicon layer 104 is a p+ silicon layer.

Silicon layer 106 is a layer of epitaxially grown silicon that is moderately doped with a p-type dopant to form a p layer. During operation of the photodiode, silicon layer 106 supports the creation of charge carriers in the form of electron-hole pairs due to the absorption of light in the silicon layers.

Doped region 108 is a region of silicon layer 106 wherein a high concentration of n-type dopant has been introduced to form an n+ region. Doped region 108 and silicon layer 106 together form a p-n junction. In an MRS Photodiode, the multiplication region (i.e., where avalanche multiplication of free-carrier pairs occurs) is localized near the p-n junction.

Resistive layer 110 is a layer of silicon carbide (SiC) that has a thickness of approximately 0.4 microns. Resistive layer 110 is deposited on silicon layer 106 in a reactive-ion plasma sputtering deposition to form a layer that has high sheet resistance. As described by Khodin, the sheet resistance of resistive layer 110 is approximately $5 \times 10^7$ to $10^8 \Omega/\square$ because a layer having this property provides an appropriate bulk resistivity.

Semitransparent metal layer 112 comprises a layer of nickel and a layer of vanadium, each having a thickness of approximately 60 nm. As a result, the transparency of semitransparent metal layer 112 to light having a wavelength shorter than 1000 nm is approximately 30-40%.

Returning now to FIG. 1A, top contact 114 and bottom contact 116 are conventional thick-film metal contacts to which wire bonds are attached. MRS Photodiode 102 is biased by applying a voltage potential across these two contacts.

In operation, photodetector 100 absorbs some portion of light that is incident upon it as a function of the wavelength of the light and the thickness of silicon layers 104 and 106. When a photon characterized by a wavelength, $\lambda 1$, which is less than 1000 nm, is absorbed in silicon layer 104, a free-carrier pair is generated by means of the photon's energy.

The free-carrier pair is accelerated by the applied electric field and creates more free-carrier pairs in the multiplication region. MRS Photodiode 102 can be thought of as a capacitor that initially holds an amount of charge, Q, which is proportional to the applied bias voltage. As free-carrier pairs are generated, the avalanche current build-up serves to discharge this capacitor (i.e., MRS Photodiode 102), and a macroscopic current begins to flow through the layers of MRS Photodiode 102 (i.e., metal layer 112, resistive layer 110, and silicon layers 104 and 106.).

As the avalanche process progresses, current through MRS Photodiode 102 increases. As a result, a voltage drop across resistive layer 110 is generated. This voltage drop reduces the voltage dropped across the multiplication regions, which reduces the electric field that accelerates free carriers. As a result, the avalanche process slows. This limits the total number of free carriers generated in an avalanche event. In other words, resistive layer 110 provides localized negative feedback that limits avalanche multiplication in MRS Photodiode 102.

Once the voltage across MRS Photodiode 102 is reduced below its breakdown voltage, the avalanche process is quenched. A recharge current provided by the applied bias voltage supply continues to flow through the feedback resistor until MRS Photodiode 102 is recharged with charge Q, thus re-arming the photodiode. Typically, the capacitor will recharge with a time constant equal to $R \cdot C_{MRS}$, where R is the resistance of resistive layer 110 and $C_{MRS}$ is the capacitance associated with the total structure of photodetector 100. In order to keep the recharge time short, it is desirable to keep the capacitance associated with photodetector 100 as small as possible.

Figure 2C:
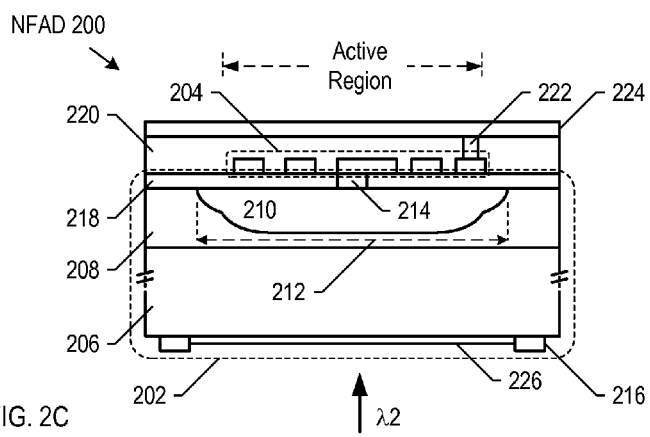
FIG. 2C depicts a cross-sectional view of details of a negative feedback avalanche detector in accordance with an illustrative embodiment of the present invention.
Figure 2A:
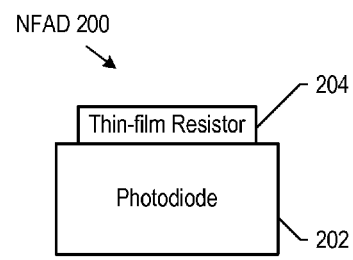
FIG. 2A depicts a schematic diagram of details of a negative-feedback avalanche detector in accordance with the illustrative embodiment of the present invention.

FIG. 2A depicts a schematic diagram of details of a negative-feedback avalanche detector (NFAD) in accordance with the illustrative embodiment of the present invention. NFAD 200 comprises photodiode 202 and thin-film resistor 204. Photodiode 202 is an indium-phosphide-based avalanche photodetector designed for operation within the wavelength range of approximately 1000 nm to 1700 nm. Resistor 204 is a thin-film resistor that provides negative feedback to photodiode 202 to enable passive quenching of an avalanche event.

Figure 2D:
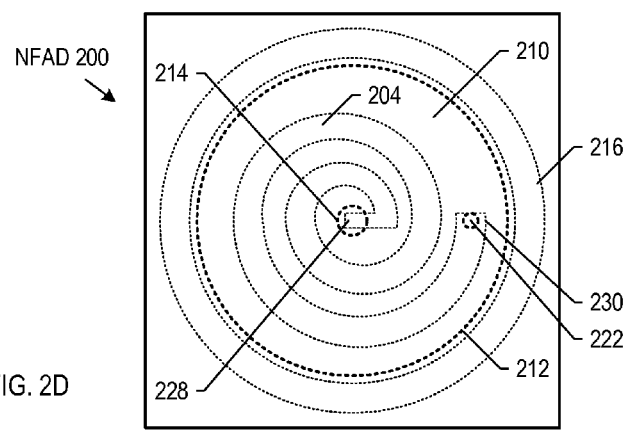
FIG. 2D depicts a top view of details of a negative feedback avalanche detector in accordance with the illustrative embodiment of the present invention.
Figure 2B:
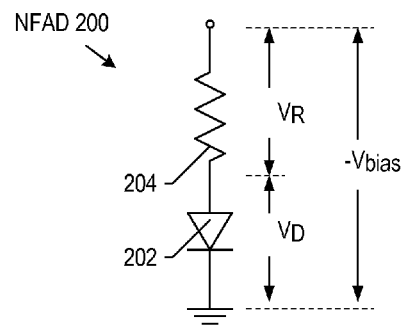
FIG. 2B depicts a circuit diagram of a negative feedback avalanche detector in accordance with the illustrative embodiment of the present invention.

FIG. 2B depicts a circuit diagram of a negative feedback avalanche detector in accordance with the illustrative embodiment of the present invention.

In operation, a negative voltage potential, $V_{bias}$, is applied across NFAD 200, to negatively bias the NFAD and charge the capacitance associated with NFAD 200. This arms NFAD 200. To enable single-photon detection the magnitude of $V_{bias}$ is larger than the breakdown voltage, $V_{br}$, of photodiode 202 by an excess voltage, $V_{ex}$ (i.e., $V_{bias}=V_{br}+V_{ex}$). Prior to absorbing a photon, no current flows through thin-film resistor 204; therefore, there is no voltage drop across resistor 204 and the voltage drop, $V_D$, across photodiode 202 is equal to $V_{bias}$.

Upon absorbing a photon, an avalanche current, i, will begin to build through photodiode 202 and resistor 204. As a result, a voltage drop, $V_R$, will appear across resistor 204 equal to $i \cdot R$, where R is the resistance of thin-film resistor 204. Once this current reaches a magnitude where the voltage drop across resistor 204 exceeds $V_{ex}$, the remaining voltage drop across photodiode 202, $V_D$, decreases below its breakdown voltage $V_{br}$. As a result, photodiode 202 is quenched and the avalanche current ceases. A recharge current continues to flow through thin-film resistor 204; however, until the capacitance associated with NFAD 200 is recharged, thus reestablishing its armed state.

The operation rate for NFAD 200 is determined by the rate at which a detectable output signal is generated, the time required to quench photodiode 202, the time required to allow trapped carriers to detrap and avoid afterpulsing, and the time required to rearm NFAD 200 after photodiode 202 is quenched. The speed at which a detectable output signal can be generated is quite fast for a typical SPAD. Passive quenching can also occur quite rapidly, but a large avalanche current leads to substantial carrier trapping and long detrapping times. Therefore, typical SPAD repetition rates are dominated by long hold-off times required to avoid afterpulsing. In contrast, a properly designed NFAD will exhibit very little avalanche current with negligible carrier trapping and associated afterpulsing. As a result, the operational rate for NFAD 200 is dominated by the time required to rearm the device. This time is determined primarily by the RC time constant associated with NFAD 200. As discussed in more detail below, and with respect to FIGS. 2C and 2D, this RC time constant is dependent on the entire capacitance of NFAD 200, which includes the capacitance associated with thin-film resistor 204. An aspect of the present invention, therefore, is the monolithic integration of thin-film resistor 204 with photodiode 202 in a manner that results in little, if any, capacitance associated with thin-film resistor 204.

In order to more clearly demonstrate the present invention, formation of NFAD 200 is described here, with reference to FIGS. 2A, 2C, 2D, and 3.

FIGS. 2C and 2D depict a cross-sectional view and top view (respectively) of details of a negative feedback avalanche detector in accordance with an illustrative embodiment of the present invention. NFAD 200 comprises photodiode 202 and thin-film resistor 204, which is monolithically integrated above photodiode 202, as depicted in FIG. 2A. Photodiode 202 comprises semiconductor layer 206, cap layer 208, doped region 210, upper contact 214 and lower contact 216. In some embodiments, photodiode 202 is operable for photons having wavelengths within the range of approximately 1000 nm to approximately 3000 nm. It will be understood by those of ordinary skill in the art that the specific wavelength range for which photodiode 202 is operable is a function of the III-V or II-VI semiconductor material system on which the photodiode is based.

FIG. 3 depicts a method of forming a negative feedback avalanche detector for detecting and counting single photons having a wavelength greater than 1000 nm in accordance with the illustrative embodiment of the present invention.

Method 300 begins with operation 301, wherein cap layer 208 is formed on semiconductor layer 206. Semiconductor layer 206 comprises a plurality of layers that form the structure that underlies the cap layer of an avalanche photodetector. It will be clear to those of ordinary skill in the art, after reading this specification, how to make and use semiconductor layer 206 in a manner suitable for an avalanche photodiode operable for photons having a wavelength within the desired range of wavelengths. In some embodiments, semiconductor layer 206 comprises a field control layer disposed on a charge grading layer disposed on an absorption layer disposed on a buffer layer disposed on a semiconductor substrate. In some embodiments, some or all of these layers will be doped with either n-type or p-type dopants. In some embodiments, some or all of these layers will comprise a III-V compound semiconductor or a II-VI compound semiconductor. Semiconductors suitable for use in any or all of the sub-layers of semiconductor layer 206 include, without limitation, gallium arsenide (GaAs), InP, indium-gallium-arsenide (InGaAs), aluminum-gallium-arsenide (AlGaAs), indium-aluminum-gallium-arsenide (InAlGaAs), indium-gallium-arsenide-phosphide (InGaAsP), cadmium-telluride (CdTe), mercury-cadmium-telluride (HgCdTe), and the like. Typically, the sub-layers of semiconductor layer 206 are epitaxially-grown on a III-V or II-VI semiconductor substrate. It will be clear to one of ordinary skill in the art, after reading this specification, how to select, make, and use semiconductors that are suitable for fabrication of a SPAD that operates at a wavelength greater than 1000 nm.

Cap Layer 208 is a layer of InP having a thickness of approximately 3 microns. Cap layer 208 is epitaxially grown on semiconductor layer 206. Cap layer 208 is undoped (i.e., intrinsic) InP. In some embodiments, cap layer 208 is a layer of semiconductor that has been lightly doped with an n-type dopant. In some embodiments, cap layer 208 is a layer of semiconductor that has been lightly doped with a p-type dopant.

At operation 302, doped region 210 is formed within cap layer 208. Doped region 210 is heavily doped with p-type dopant and forms a p-n junction within cap layer 208. The lateral extent of doped region 210 defines perimeter 212, which is approximately 15 microns in diameter. The doping profile of doped region 210 also defines the "active region" of photodiode 202. In some embodiments, the active region is smaller than perimeter 212. In some embodiments, perimeter 212 has a diameter within the range of approximately 1 micron to approximately 50 microns. In some embodiments, doped region 210 is a region that is heavily doped with an n-type dopant to form an $n^+$ doped region. Doped region 210 extends vertically downward into cap layer 208 but leaves a thin portion of cap layer 208 undoped. This undoped portion of cap layer 208, which lies under doped region 210, embodies the multiplication region of photodiode 202. In some embodiments of the invention, doped region 210 is created by doping the entire cap layer 208 at an earlier step in the fabrication process (e.g, during epitaxial growth) and then creating perimeter 212 by physically removing the cap layer material outside perimeter 212.

At operation 303, passivation layer 218 is formed on top of cap layer 208. Passivation layer 218 is a layer of silicon nitride having a thickness of approximately 100-nm. It will be clear to one of ordinary skill in the art how to make and use passivation layer 218.

At operation 304, top contact 214 is formed using conventional patterning, etching, and deposition techniques. Top contact 214 is a layer of p-contact metallization and is electrically-connected to doped region 210. It will be clear to one of ordinary skill in the art how to make and use top contact 214. In embodiments wherein the doped region is doped to be n-type, top contact 214 is a layer of n-contact metallization. In some embodiments, the size of top contact 214 is much smaller than would normally be associated with a typical avalanche photodiode. Normally, this would be undesirable since smaller contacts exhibit larger contact resistance. In the case of the present invention, however, the contact resistance of top contact 214 simply adds to the resistance of thin-film resistor 204.

At operation 305, bottom contact 216 is formed using conventional techniques. It will be clear to one of ordinary skill in the art how to make and use bottom contact 216.

At operation 306, anti-reflection layer 226 is formed. Anti-reflection layer 226 is a layer of material suitable for reducing the reflection of light having wavelength, $\lambda 2$, from the surface of semiconductor layer 206. It will be clear to one of ordinary skill in the art how to make and use anti-reflection layer 226.

After the completion of operations 301 through 306, photodiode 202 is complete and is operable as a stand-alone photodetector. In this state, it is analogous to a prior-art SPAD that operates at wavelengths greater than 1000 nm. Photodiode 202 is characterized by a capacitance, $C_p$, which is a function of its layer structure and geometry.

At operation 307, thin-film resistor 204 having first terminal 228 and second terminal 230 is formed on passivation layer 218. Once formed, thin-film resistor 204 and photodiode 202 are monolithically integrated and thin-film resistor 204 and top contact 214 are electrically-connected at first terminal 228. Thin-film resistor 204 is a layer of electrically conductive material that has a suitable sheet resistance (e.g., 50-500Ω/□). This layer is patterned to form a resistor having a value of approximately 100 KΩ. In some embodiments, thin-film resistor 204 has a resistance value within the range of approximately 10 KΩ to approximately 10 MΩ. Although in the illustrative embodiment thin-film resistor 204 is patterned into a spiral shape that extends from first terminal 228 to second terminal 230 (as depicted in FIG. 2D), it will be clear to those of ordinary skill in the art, after reading this specification, how to make and use alternative embodiments of the present invention wherein thin-film resistor 204 is patterned into any suitable shape.

In some embodiments, thin-film resistor 204 is patterned using well-known "lift-off" techniques. In some embodiments, thin-film resistor 204 is patterned using full-surface deposition or selective area deposition, followed by subtractive patterning using photolithography and etching techniques. Suitable materials for use in thin-film resistor 204 include, without limitation, nickel-chrome (NiCr), titanium nitride (TiN), titanium, platinum, gold, tungsten, and the like.

An aspect of some embodiments of the present invention is the fact that thin-film resistor 204 lies substantially completely within the boundary of doped region 210 (i.e., within perimeter 212). By keeping thin-film resistor 204 within perimeter 212, the addition of the resistor does not substantially increase the capacitance, $C_D$, of NFAD 200 significantly beyond the capacitance of photodiode 202, $C_p$, alone. This is due to the fact that much of resistor 204 is at substantially the same voltage potential as doped region 210 (by virtue of top contact 214). In addition, the surface area of thin-film resistor 204 is small by virtue of the fact that it comprises a narrow width line. As a result, there is no electric field developed between doped region 210 and thin-film resistor 204.

The recharge time constant for NFAD 200 is approximately equal to $R \cdot C_D$, where R is the resistance of resistor 204. Since resistor 204 adds little or no capacitance to the photodetector structure, the capacitance of NFAD 200, $C_D$, remains approximately equal to the capacitance of photodiode 202, $C_p$, alone. To facilitate single-photon detection, photodiode 202 has a capacitance, $C_p$, within the range of approximately 1 femtoFarad (fF) to approximately 50 fF. Typically, photodiode 202 has a capacitance, $C_p$, of approximately 10 fF.

The effect that the capacitance of thin-film resistor 204 has on the RC time constant of NFAD 200 can also be considered from the perspective of charge accumulation. Since the total voltage drop across thin-film resistor 204 is no larger than $V_{ex}$ (which is typically ~1-3 V), the average voltage bias across resistor 204 is limited to $V_{ex}/2$. In the illustrative embodiment with a $V_{ex}=1$ V, for example, the charge flow due to thin-film resistor 204 is approximately only $3 \times 10^3$ carriers. This is roughly 1 to 2 orders of magnitude smaller than the number of carriers generated in discharging the capacitance $C_D$ of NFAD 200. As a result, the effect of resistor 204 on the RC time constant of NFAD 200 is less than approximately 5%.

At operation 308, dielectric layer 220 is formed over thin-film resistor 204. Dielectric layer 220 is a layer of dielectric material having a thickness of approximately 1 micron. It will be clear to those of ordinary skill in the art how to select a suitable thickness and material for dielectric layer 220. Suitable materials for dielectric layer include, without limitation, nitrides of silicon, oxides of silicon, insulating polymer layers, and the like.

At operation 309, electrically conductive via 222 is formed through dielectric layer 220. Via 222 is located within perimeter 212 and via 222 and thin-film resistor 204 are electrically-connected at second terminal 230. It will be clear to those of ordinary skill in the art how to make and use electrically conductive via 222.

At operation 310, bond pad 224 is formed on dielectric layer 220. Once formed bond pad 224, electrically conductive via 222, thin-film resistor 204, and top contact 214 are all electrically-connected. In some embodiments, bond pad 224 extends beyond perimeter 212. In these embodiments, the thickness of dielectric layer 220 is chosen to provide sufficient physical separation of contact pad 224 and cap layer 208 to ensure that negligible capacitance is added to NFAD 200 due to the presence of the contact pad. In some embodiments, contact pad 224 does not extend beyond perimeter 212.

Figure 4:
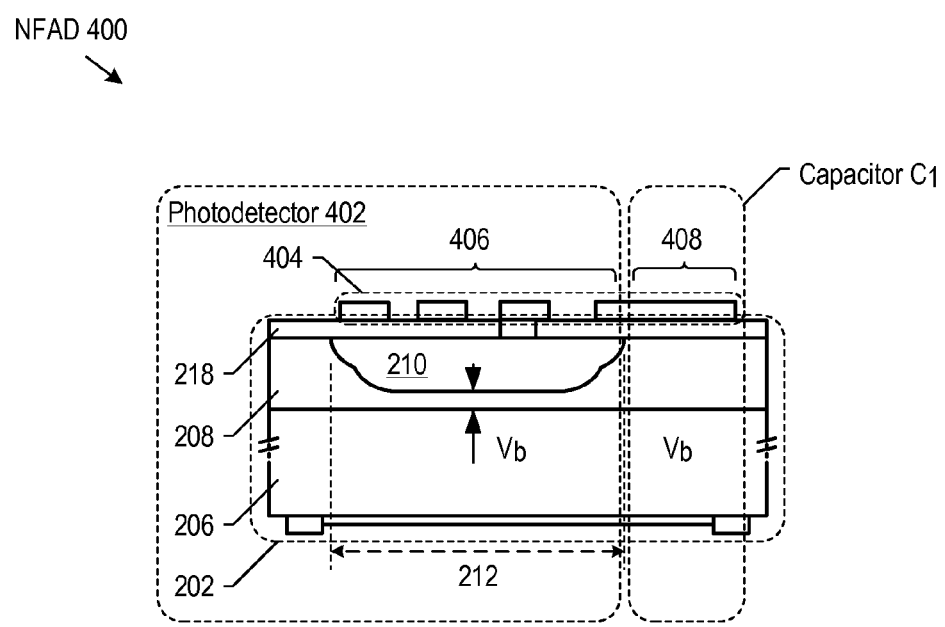
FIG. 4 depicts a cross-sectional view of details of a negative-feedback avalanche detector for detecting and counting single photons having a wavelength greater than 1000 nm in accordance with an alternative embodiment of the present invention.

FIG. 4 depicts a cross-sectional view of details of a negative-feedback avalanche detector for detecting and counting single photons having a wavelength greater than 1000 nm in accordance with an alternative embodiment of the present invention. NFAD 400 comprises thin-film resistor 404 that is formed on passivation layer 218 in analogous fashion to the formation of thin-film resistor 204 on photodiode 202. In contrast to thin-film resistor 204, however, thin-film resistor 404 has two portions—first resistor portion 406 that is located within perimeter 212 and second resistor portion 408 that extends beyond perimeter 212. As a result, NFAD 400 embodies a structure that comprises photodetector 402 and additional capacitor $C_1$.

Photodetector 402 is analogous to NFAD 200 and exhibits substantially the same capacitance, $C_D$. As with NFAD 200, the addition of first resistor portion 406, which is located within perimeter 212, does not add substantially to the capacitance of photodetector 402. As a result, $C_D$ is approximately equal to $C_p$.

Capacitor $C_1$, having a capacitance of $C_R$, comprises a resistor-dielectric-semiconductor structure including second resistor portion 408, passivation layer 218, and semiconductor layer 206. During operation, capacitor $C_1$ charges and discharges during each avalanche event. As a result, the capacitance, $C_R$, of capacitor $C_1$ is included in the time constant at which NFAD 400 is recharged, and the charge flowing off capacitor $C_1$ during an avalanche event adds to the charge flow associated with discharging capacitance $C_D$ of NFAD 200.

It should be noted, however, that the resistance of second resistor portion 408 is selected as less than 10% of the resistance of resistor 404. For $V_{ex}=1V$, the average voltage drop across the length of second resistor portion 408 is less than or equal to 0.1 V. The average voltage potential of second resistor portion 408, therefore, will remain within 0.05 V of $V_{bias}$ through the entire avalanche/rearming cycle. As a result, the amount of charge that accumulates and dissipates in capacitor $C_1$ during an avalanche/rearming cycle does not appreciably increase the RC time constant or charge flow associated with NFAD 400. In some embodiments, the length of second resistor portion 408 is within the range of 0.1% to approximately 50% of the length of resistor 404. An aspect of the present invention is that the capacitance associated with resistor 404 is limited to no more than 10 times the capacitance, $C_p$, of photodiode 202 alone.

The recharge time constant of NFAD 400 is approximately equal to $R \cdot (C_D + C_R)$ where R is the resistance of resistor 404, $C_D$ is the capacitance of photodetector 402, and $C_R$ is the capacitance of capacitor $C_a$. In order to achieve SPAD operation at a rate that exceeds 10 MHz, the RC time constant of NFAD 400 is kept below 100 ns. For typical SPADs and for reasonable resistor values, this demands that the capacitance of second resistor portion 408 is kept to a value less than or equal to 10 times the capacitance of photodetector 402.

Figure 5:
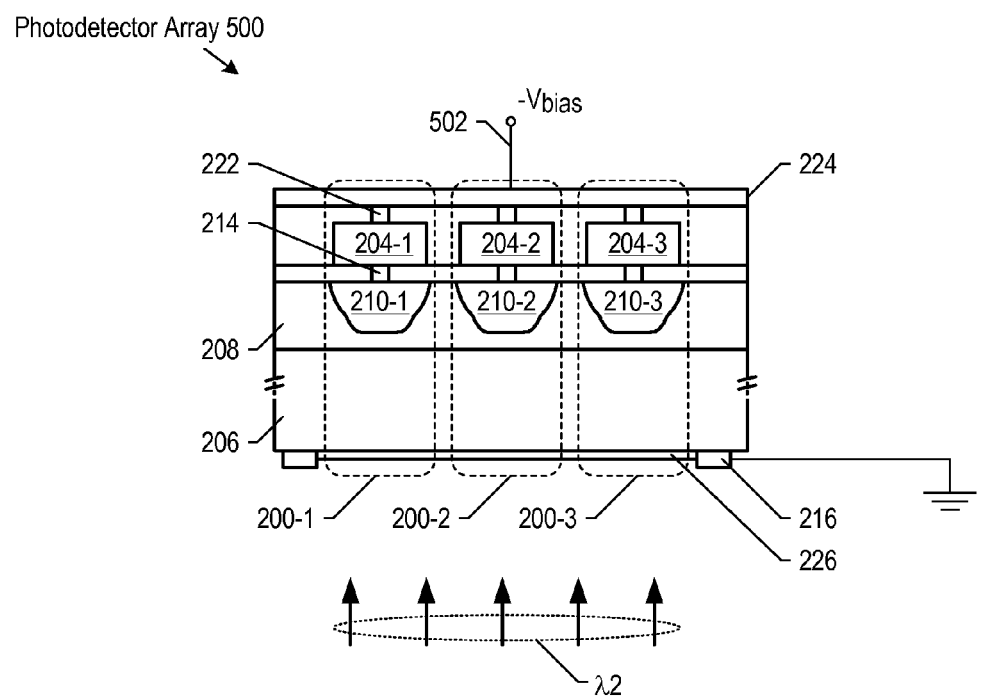
FIG. 5 depicts a cross-sectional view of a photodetector array for detecting and counting single photons having a wavelength greater than 1000 nm in accordance with the illustrative embodiment of the present invention.

FIG. 5 depicts a cross-sectional view of a photodetector array for detecting and counting single photons having a wavelength greater than 1000 nm in accordance with the illustrative embodiment of the present invention. Photodetector array 500 comprises NFADs 200-1, 200-2, and 200-3. NFADs 200-1, 200-2, and 200-3 are monolithically integrated.

Each of the top contacts 222 of NFADs 200-1, 200-2, and 200-3 (and, therefore, each of resistors 2040-1, 204-2, and 204-3) is electrically-connected via common contact pad 224. In similar fashion, NFADs 200-1, 200-2, and 200-3 are electrically-connected through bottom contact 216 and silicon layer 206. As a result, NFADs 200-1, 200-2, and 200-3 are negatively biased by voltage bias, $V_{bias}$, which is applied between contact pad 224 and bottom contact 216.

A single NFAD is unable to differentiate between the arrival of a single photon and the arrival of a plurality of photons within one avalanche/rearming cycle. This is due to the fact that when an NFAD receives a first photon, the resulting avalanche is self-regulated to quench once it results in a sufficient voltage drop across its associated thin-film resistor 204. The arrival of a second photon during this avalanche process, therefore, does not affect the output signal of the NFAD. As a result, the arrival of the second photon is not detected.

Photodetector array 500, however, can detect the simultaneous arrival of multiple photons, as long as those photons are not incident upon the same NFAD within the photodetector. For the purposes of this specification, a first and second photon are considered as having arrived simultaneously if the second photon arrives prior to the conclusion of an avalanche/rearming cycle that occurs in response to the arrival of the first photon. In operation, photodetector array 500 provides an output current pulse of magnitude X on output 502 in response to a first photon that is incident upon one of NFADs 200-1, 200-2, and 200-3, for example, on NFAD 200-1. The current pulse is generated by NFAD 200-1 due to an avalanche/rearming cycle that occur in response to the incident photon. The value of X is dependent upon the specific design of NFADs 200-1, 200-2, and 200-3, and is substantially identical no matter which NFAD receives the photon since the NFADs are substantially identical. It should be stressed that for sufficiently small parasitic capacitance and sufficiently large negative feedback resistor, the total charge that flows during an avalanche event is substantially equal to the product of the capacitance, $C_p$, of photodiode 202 and the excess voltage $V_{ex}$. Such quantization of the current pulse resulting from the reception of a single photon does not occur in a prior-art SPAD. If a second photon is incident upon one of the other NFADs during the avalanche/rearming cycle of NFAD 200-1 (e.g., on NFAD 200-3), NFAD 200-3 will generate a second current pulse on output 502, thereby doubling the magnitude of the output signal on output 502 to 2×. Should a third photon arrive at NFAD 200-2 during this period, the output signal on output 502 would grow to 3×. Photodetector array 500, therefore, provides a quantized output signal based on the number of photons received within a time period.

As the number of NFADs included in photodetector array 500 increases, the probability of multiple photons hitting a single NFAD 200 reduces. In addition, the accuracy with which photons can be counted increases with increasing number of NFADs in photodetector array 500. In some embodiments of the present invention, photodetector array 500 comprises a number of NFADs that is within the range of 2 to 1000. It should be noted that for a 10×10 array of NFADs, the probability of two photons being incident on the same photodetector is approximately 1%.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An article comprising a first detector that is characterized by a first RC time constant, wherein the first detector comprises:
   a first photodiode for producing a first electrical signal in response to receipt of a single photon that has a wavelength greater than 1000 nm, wherein the first photodiode has a first doped region that has a first perimeter, and wherein the first photodiode is characterized by a first photodiode capacitance, $C_{p1}$; and
   a first thin-film resistor;
   wherein the first thin-film resistor and the first photodiode are electrically connected and monolithically integrated such that (1) the first thin-film resistor is disposed above the first doped region and located substantially completely within the first perimeter and (2) the effect of the integration of the first thin-film resistor on the first RC time constant is less than approximately 5%.

2. The article of claim 1 wherein $C_{D1}$ is substantially equal to $C_{p1}$.

3. The article of claim 1 wherein the first active region has a diameter that is less than or equal to 15 microns.

4. The article of claim 1 further comprising a second detector, wherein the second detector comprises:
   a second photodiode for producing a second electrical signal in response to receipt of a single photon that has a wavelength greater than 1000 nm, wherein the first photodiode and the second photodiode are monolithically integrated, and wherein the second photodiode has a second doped region that has a second perimeter, and wherein the second photodiode is characterized by a second photodiode capacitance, $C_{p2}$; and
   a second thin-film resistor, wherein the second thin-film resistor and the second photodiode are monolithically integrated and electrically-connected, and wherein the second thin-film resistor is disposed above the second doped region, and further wherein the second thin-film resistor is located substantially completely within the second perimeter;
   wherein the second detector is characterized by a second detector capacitance, $C_{D2}$, and wherein $C_{D2}$ is within the range of approximately $C_{p2}$ to approximately 1.05 $C_{p2}$.

5. The article of claim 4 wherein:
   the first resistor has a first terminal and a second terminal, and the first terminal and the first photodiode are electrically-connected;
   the second resistor has a third terminal and a fourth terminal, and the third terminal and the second photodiode are electrically-connected; and
   the second terminal and the fourth terminal are electrically-connected.

6. An article comprising a first detector that is characterized by a first RC time constant, wherein the first detector comprises:
   a first avalanche photodiode that is physically adapted to provide an electrical signal in response to a received photon having a wavelength greater than 1000 nm, wherein the first avalanche photodiode comprises a first active region having a first perimeter, and wherein the first photodiode is characterized by a first photodiode capacitance, $C_{p1}$; and
   a first thin-film resistor having a first terminal and a second terminal, wherein the first thin-film resistor resides substantially completely within the first perimeter, and wherein the first thin-film resistor is characterized by a first resistance, R, between the first terminal and the second terminal, and further wherein the first resistance is within the range of approximately 10 kΩ to approximately 10 MΩ;
   wherein the first terminal and the first active region are electrically connected; and
   wherein the first avalanche photodiode and the first thin-film resistor are monolithically integrated such that the effect of the integration of the first thin-film resistor on the first RC time constant is less than approximately 5%.

7. The article of claim 6 further comprising a second detector, wherein the second detector comprises:
   a second avalanche photodiode that is physically adapted to provide an electrical signal in response to a received photon having a wavelength greater than 1000 nm, wherein the second avalanche photodiode comprises a second active region having a second perimeter, and wherein the second photodiode is characterized by a second photodiode capacitance, $C_{p2}$; and
   a second thin-film resistor having a third terminal and a fourth terminal, wherein the second thin-film resistor resides substantially completely within the second perimeter, and wherein the second thin-film resistor is characterized by a second resistance between the third terminal and the fourth terminal, and further wherein the second resistance is within the range of approximately 10 kΩ to approximately 10 MΩ;
   wherein the second avalanche photodiode and the second thin-film resistor are monolithically integrated;
   wherein the third terminal and the second active region are electrically connected; and
   wherein the second detector is characterized by a second detector capacitance, $C_{D2}$, and wherein $C_{D2}$ is within the range of approximately $C_{p2}$ to approximately 1.05 $C_{p2}$.

8. The article of claim 7 wherein the second terminal and the fourth terminal are electrically connected.

9. The article of claim 8 wherein the first avalanche photodiode and the second avalanche photodiode are monolithically integrated on a substrate.

10. The article of claim 6 wherein the first avalanche photodiode and the first thin-film resistor collectively define an RC time constant, and wherein the RC time constant is less than 100 ns.

11. The article of claim 6 wherein $C_{D1}$ is substantially equal to $C_{p1}$.

12. The article of claim 6 further comprising a first plurality of second detectors, wherein the first detector and the first plurality of second detectors are electrically connected in parallel and collectively define a detector array, and wherein each of the first plurality of second detectors comprises:
   a second avalanche photodiode that is physically adapted to provide an electrical signal in response to a received photon having a wavelength greater than 1000 nm, wherein the second avalanche photodiode comprises a second active region having a second perimeter, and wherein the second photodiode is characterized by a second photodiode capacitance, $C_{p2}$; and
   a second thin-film resistor having a third terminal and a fourth terminal, wherein the second thin-film resistor is monolithically integrated with the second avalanche photodiode and resides substantially completely within the second perimeter, and wherein the second thin-film resistor is characterized by a second resistance between the third terminal and a fourth terminal, and further wherein the second resistance is within the range of approximately 10 kΩ to approximately 10 MΩ;
   wherein the second terminal and each of the fourth terminals are electrically connected at a common output terminal, and wherein each detector of the detector array is characterized by an avalanche/rearming cycle, and further wherein the common output terminal provides an output signal having a magnitude that indicates the number of detectors of the detector array that have received a photon within the avalanche/rearming cycle of a first photon receiving detector.

13. The article of claim 1 further comprising a first plurality of second detectors, wherein the first detector and the first plurality of second detectors are electrically connected in parallel and collectively define a detector array, and wherein each of the first plurality of second detectors comprises: a second photodiode for producing a second electrical signal in response to a received photon that has a wavelength greater than 1000 nm, wherein the second avalanche photodiode has a second doped region that has a second perimeter, and wherein the second photodiode is characterized by a second photodiode capacitance, $Cp2$; and a second thin-film resistor having a third terminal and a fourth terminal, wherein the second thin-film resistor and the second photodiode are monolithically integrated and electrically connected, and wherein the second thin-film resistor is disposed above the second doped region, and further wherein the second thin-film resistor is located substantially completely with the first perimeter; wherein each detector of the detector array is characterized by an avalanche/rearming cycle, and wherein the detector array provides an output signal having a magnitude that indicates the number of detectors of the detector array that have received a photon within the avalanche/rearming cycle of a first photon receiving detector.

* * * * *